United States Patent
Yach (10) Patent No.: US 10,177,053 B2
(45) Date of Patent: *Jan. 8, 2019

(54) INTERCONNECT MONITOR UTILIZING BOTH OPEN AND SHORT DETECTION

(71) Applicant: Microchip Technology Incorporated, Chandler, AZ (US)

(72) Inventor: Randy L. Yach, Phoenix, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/447,656

(22) Filed: Mar. 2, 2017

(65) Prior Publication Data

US 2017/0256469 A1  Sep. 7, 2017

Related U.S. Application Data

(60) Provisional application No. 62/302,944, filed on Mar. 3, 2016.

(51) Int. Cl.
*H01L 21/66* (2006.01)
*H01L 21/67* (2006.01)

(52) U.S. Cl.
CPC ........ *H01L 22/34* (2013.01); *H01L 21/67288* (2013.01); *H01L 22/30* (2013.01); *H01L 22/32* (2013.01)

(58) Field of Classification Search
CPC .......... H01L 22/30; H01L 22/32; H01L 22/34
See application file for complete search history.

(56) References Cited

U.S. PATENT DOCUMENTS

| | | | |
|---|---|---|---|
| 7,919,973 B2 | 4/2011 | Yach et al. | 324/750.3 |
| 8,878,183 B2 | 11/2014 | Yach | 257/48 |
| 2003/0002338 A1 | 1/2003 | Xu et al. | 365/185.11 |

(Continued)

OTHER PUBLICATIONS

International Search Report and Written Opinion, Application No. PCT/US2017/020575, 14 pages, dated May 16, 2017.

*Primary Examiner* — Thanhha S Pham
(74) *Attorney, Agent, or Firm* — Slayden Grubert Beard PLLC (57) ABSTRACT

The present disclosure relates to semiconductor manufacturing and the teachings of the present disclosure may be embodied in a semiconductor chip with an interconnect monitor. Some embodiments may include arrays of diodes on the semiconductor chip; each diode with a stack of vertical interconnects and metal contacts, the stack and the diode connected in series and control mechanisms for addressing the diodes. The control mechanisms may include first inverters for applying either a high or a low voltage to columns of the diode stacks, connected at one end of each diode stack. Each first inverter may include reverse logic receiving a reverse logic signal and configured to invert a logic signal fed to the device for applying a relatively high or low voltage and second inverters for applying either a high or a low voltage to rows of the diode stack in the one of the plurality of arrays, connected at a second end of said diode stack, wherein each second inverter comprises reverse logic receiving an inverted reverse logic signal and configured to invert a logic signal fed to the device for applying a relatively high or low voltage.

13 Claims, 7 Drawing Sheets

(56) References Cited

U.S. PATENT DOCUMENTS

| | | | |
|---|---|---|---|
| 2006/0022693 A1 | 2/2006 | Bazan et al. | 324/762.02 |
| 2008/0308883 A1 | 12/2008 | Hong | 257/412 |
| 2008/0315195 A1* | 12/2008 | Yach | H01L 22/34 257/48 |
| 2009/0037131 A1 | 2/2009 | Hess et al. | 702/117 |
| 2013/0188667 A1 | 7/2013 | Edwards | 374/179 |
| 2014/0264333 A1 | 9/2014 | Yach | 257/48 |

* cited by examiner

INTERCONNECT MONITOR UTILIZING BOTH OPEN AND SHORT DETECTION

RELATED PATENT APPLICATION

This application claims priority to commonly owned U.S. Provisional Patent Application No. 62/302,944; filed Mar. 3, 2016; which is hereby incorporated by reference herein for all purposes.

TECHNICAL FIELD

The present disclosure relates to semiconductor manufacturing and the teachings of the present disclosure may be embodied in a semiconductor chip with an interconnect monitor.

BACKGROUND

Integrated circuits grow increasingly complex and the associated manufacturing processes are more complicated. The complications result in lower yield and higher cost for IC devices. New IC designs are reduced in size and yet the number of elements in a given chip is increased. The increasing complexity requires an increased number of connections between elements as well.

During normal IC manufacturing processes, various layers of semiconductor material, metals, insulators, and other materials are deposited, patterned, and/or etched to create electronic circuitry between circuit elements. The circuit connections may be horizontal or vertical, considered in relation to the plane of the underlying substrate, or chip. Vertical connections, called vias, may connect two metal layers, one metal layer and a semiconductor layer, or other combinations. In comparison to horizontal connections, vias tend to be very small and, therefore, more prone to failure if there are any defects or irregularities in a manufacturing process.

A faulty via may interrupt or change the flow of electricity in the circuitry of an IC device. In particular, a faulty via may not fail upon completion of the circuit, but only after degrading over time in use. An IC device may pass any quality control checks during the manufacturing process and still fail prematurely. U.S. Pat. Nos. 7,919,973 and 8,878,183 describe a so-called contact/via test vehicle which facilitates a monitoring process in the semiconductor fabrication of integrated circuits, whose products may encompass a myriad application in various technical fields. These two patents are hereby incorporated by reference in their entirety.

SUMMARY

Since the introduction of the contact/via test vehicle, a number of needed improvements have been identified. For example, the original purpose of the contact/via test chip was to detect open interconnects, but it would be advantageous to also detect interconnect shorts. The teachings of the present disclosure may be embodied in a semiconductor chip with an interconnect monitor.

Some embodiments may include arrays of diodes on the semiconductor chip; each diode with a stack of vertical interconnects and metal contacts, the stack and the diode connected in series and control mechanisms for addressing the diodes. The control mechanisms may include first inverters for applying either a high or a low voltage to columns of the diode stacks, connected at one end of each diode stack. Each first inverter may include reverse logic receiving a reverse logic signal and configured to invert a logic signal fed to the device for applying a relatively high or low voltage and second inverters for applying either a high or a low voltage to rows of the diode stack in the one of the plurality of arrays, connected at a second end of said diode stack, wherein each second inverter comprises reverse logic receiving an inverted reverse logic signal and configured to invert a logic signal fed to the device for applying a relatively high or low voltage.

In some embodiments, the diodes are formed by a first p-type semiconductor deposition into an n-type well arranged within a p-type substrate. The semiconductor chip may include electrical connections for each diode, the electrical connections each formed by of a second p-type semiconductor deposition into the p-type substrate and a plurality of p-n-p parasitic transistors comprised of said electrical connections, said p-type substrate, said n-type well, and said first p-type semiconductor depositions.

In some embodiments, the parasitic transistors share a physical location with said diodes, and said parasitic transistors and said diodes are connected in parallel.

In some embodiments, a plurality of p-type semiconductor regions are deposited adjacent to each said diode, and the p-type semiconductor regions are connected to the terminal of a transistor adjacent to the diode in the substrate of the chip.

In some embodiments, the p-type semiconductor regions adjacent to each diode in an array are connected.

In some embodiments, the p-type semiconductors regions are connected to a first voltage, said voltage having a lower potential than said high voltage applicable to a column of diode and stack combinations.

In some embodiments, the plurality of control mechanisms further comprises transistors for disconnecting voltage sources to allow unselected diodes from the plurality of diodes to float.

Some embodiments may comprise a semiconductor chip for process monitoring of semiconductor fabrication. The chip may include a plurality of arrays disposed on the semiconductor chip. Each array may include a plurality of diodes, each diode formed in the chip and associated with a stack including a plurality of vertical interconnects and metal contacts, each one of the plurality of diodes and the associated stack connected in series to form a diode stack combination. The chip may further include a plurality of control mechanisms for addressing the plurality of diodes. The control mechanisms may include a device for applying a relatively high or low voltage to one or more columns of the diode stack combinations in a given array, connected at a first end of said diode stack combination; a device for applying a relatively high or low voltage to one or more rows of the diode stack combinations in a given array, connected at a second end of said diode stack combination, and a current meter measuring a current through the diode stack combinations.

In some embodiments, the control mechanisms comprise inverters.

Some embodiments may include a plurality of electrical connections for each diode, wherein the diodes comprise a p-n transition within said semiconductor chip formed by a first p-type semiconductor deposition into an n-type well arranged in a p-type substrate; the electrical connections including deposition of a second p-type semiconductor into the p-type substrate; and the plurality of arrays further comprising a plurality of p-n-p parasitic transistors comprising the plurality of electrical connections, the p-type substrate, the n-type well, and the first p-type semiconductor depositions.

In some embodiments, each parasitic transistor shares a physical location with an associated diode, and the parasitic transistors and the diodes are connected in parallel.

Some embodiments may include a plurality of p-type semiconductor regions arranged adjacent to each diode, the p-type semiconductor regions connected to the terminal of a transistor adjacent to the diode in the substrate of the semiconductor chip.

In some embodiments, the p-type semiconductor regions adjacent to each diode in a given array are connected to each other.

Some embodiments may include the p-type semiconductors connected to a first voltage with a lower potential than the relatively high voltage applicable to a column of diode and stack combinations.

DETAILED DESCRIPTION

Figure 1:
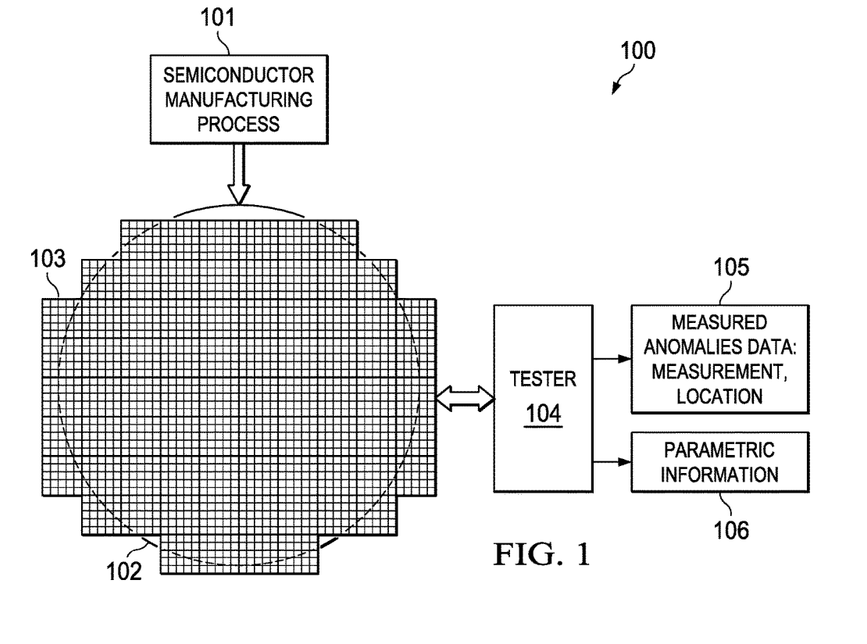
FIG. 1 is a drawing showing an example system which may be used to monitor a semiconductor manufacturing process by testing electronic circuitry on a semiconductor chip, according to teachings of the present disclosure.

FIG. 1 is a drawing showing an example system 100 which may be used to monitor a semiconductor manufacturing process by testing electronic circuitry on a semiconductor chip, according to teachings of the present disclosure. System 100 may include a semiconductor manufacturing process 101 to be monitored. A semiconductor wafer 102 may include a plurality of chips 103 created by the process 101. In some embodiments, each chip 103 may include a plurality of diodes arranged in an addressable array 200 (shown in more detail in FIG. 2). Each diode may have an associated stack of vertical interconnects and metal contacts.

System 100 may include a probing tester 104 to take data related to each stack for comparison against a manufacturing specification. In some embodiments, tester 104 may test 10 different chips 103 in parallel. In some embodiments, tester 104 may test all ten chips 103 at the same time. In some embodiments, tester 104 may test the same stack on all ten chips 103 at the same time. Tester 104 yields anomaly data 105, including for example, data sets for measured anomalies, including a measurement and a location of the measurement. Anomalies may include current measurements or associated resistance calculations for vias on the wafer. For example, an "open" via may not conduct any current and/or may show a very high resistance. As another example, a short circuit between contacts may conduct too much current and/or show a very low resistance. In some embodiments, tester 104 may identify any elements that do not meet predefined criteria for current and/or resistance.

Tester 104 may also yield parametric information 106 comprising details of the tests as conducted. Analysis of the parametric information 106 in light of the information 105 may detect and/or identify possible problems in the tested manufacturing processes.

A test chip as contemplated in the present disclosure may be used to detect open interconnects as well as interconnect short circuits or shorts. The prior test vehicles used a memory mapped diode array to detect open circuits in the formation of contacts and vias. The various embodiments of the present disclosure use a "reversible decoder" to switch the polarity of the decoders to check for shorts. This capability coupled with layout techniques make this test vehicle more sensitive to inadvertent shorts in metal and contacts. Further, this can all be accomplished while still maintaining the ability to electrically isolate the defect.

Figure 2:
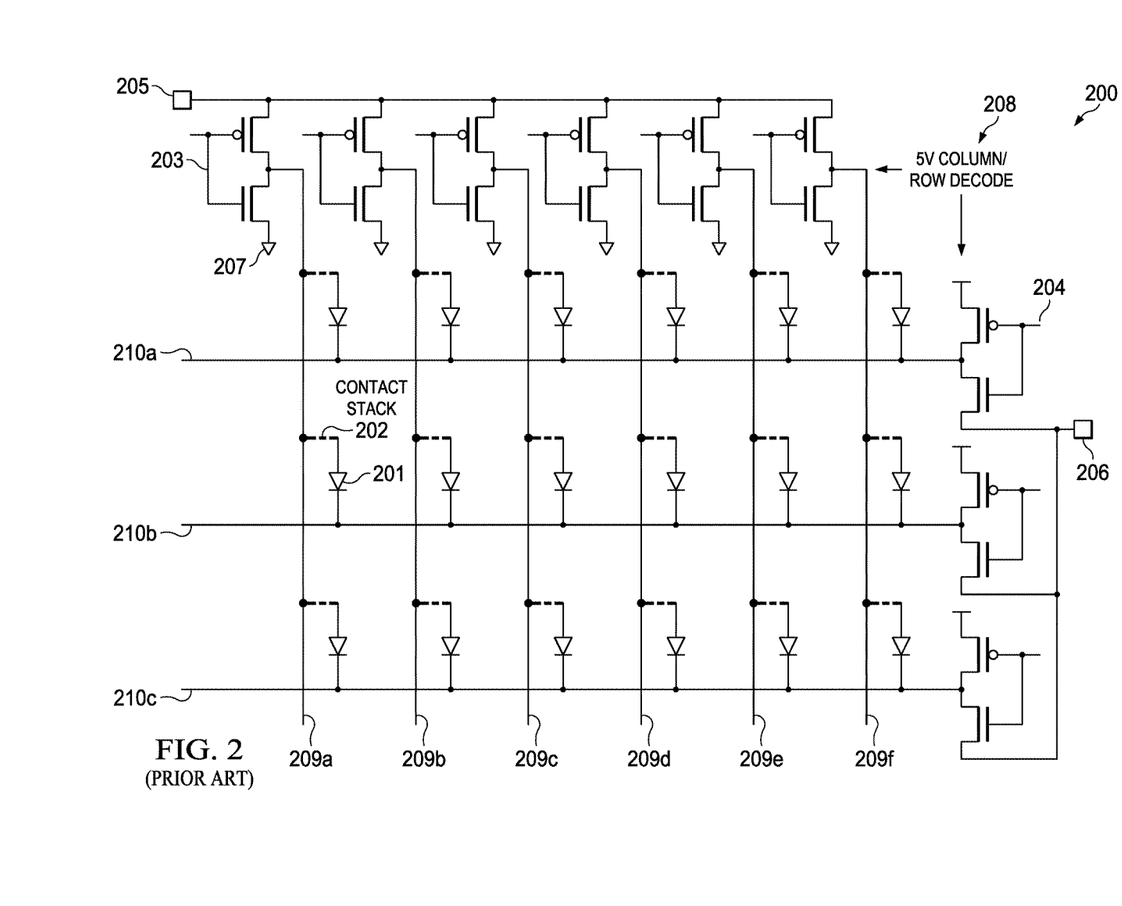
FIG. 2 is a drawing showing an example electrical circuit including an array of diodes according to the teachings of the prior disclosures.

FIG. 2 is a drawing showing an example electrical circuit 200 including an array of diodes 201 according to the teachings of the prior disclosures. For purposes of illustration, so the diodes 201 may be addressed as an array, the drawing of circuit 200 shows the diodes 201 laid out and connected as a two-dimensional array with columns and rows. Each diode 201 in the array of diodes has an associated stack 202 of vertical interconnects and metal contacts, which may include a polysilicon diode covered with a silicide layer (discussed in detail in relation to FIG. 3).

Electrical circuit 200 may include a column inverter 203 connected to each column 209 of diodes 201 at the respective cathodes. Column inverters 203 may act as a control mechanism to select a column 210 for testing the diode 201 and associated stack 202. A voltage source 205 may be connected to all the column inverters 203. In some embodiments, voltage source 205 may be four volts.

Electrical circuit 200 may include a row inverter 204 connected to each row 210 of diodes 201 at the respective anodes. Row inverters 204 may act as a control mechanism to select a row 210 for testing the diode 201 and associated stack 202. A voltage sink 206 may be connected to all the row inverters 204. In some embodiments, voltage sink 206 may be one volt.

Each column inverter 203 may include inputs allowing selection of voltage source 205 (a relatively high voltage) or voltage source 207 (a relatively low voltage). Voltage source 207 may be ground. Each row inverter 204 may include inputs for selecting whether the row inverter 204 will route the voltage sink 206 or a high voltage 208. In some embodiments, high voltage 208 may be five volts. Any given stack 202 of vertical interconnects and contacts will then be in series with the column inverter 203 and a diode 201.

Figure 3:
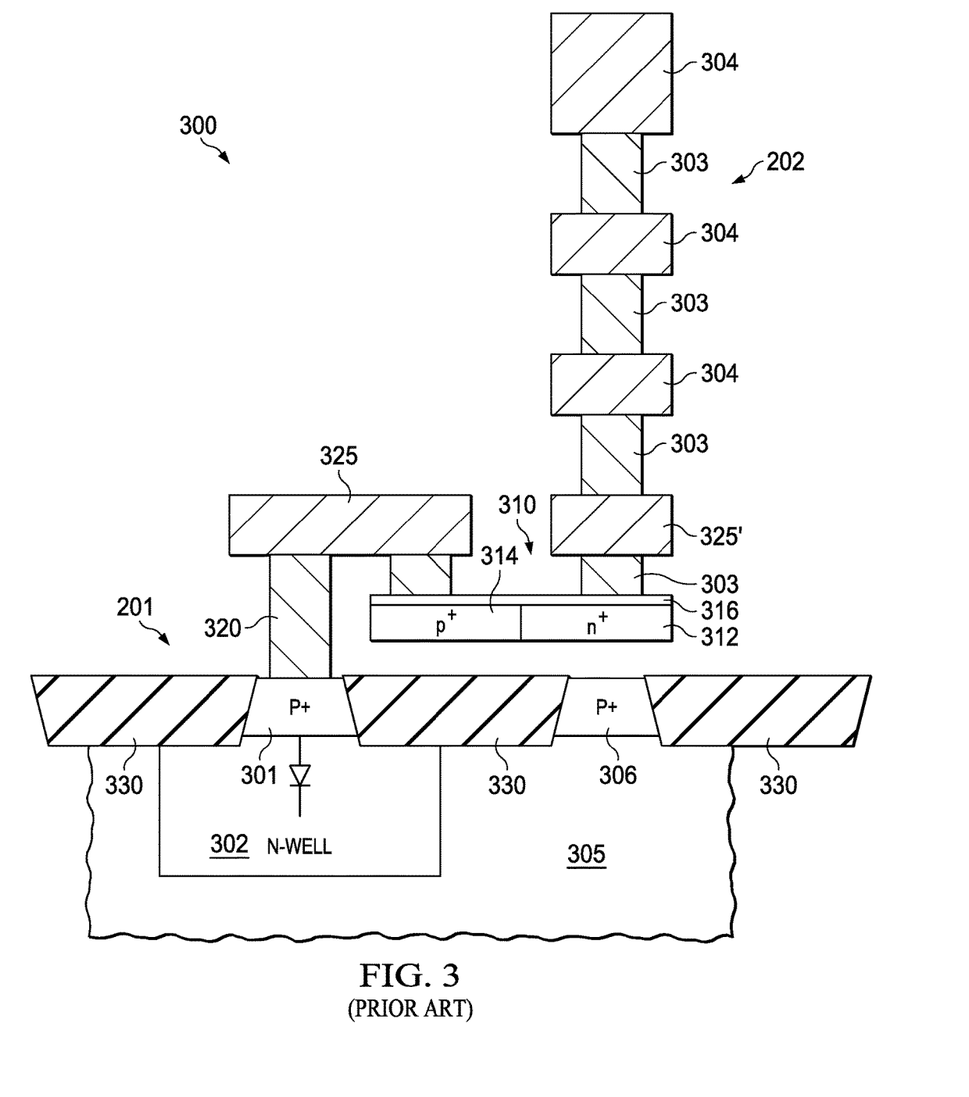
FIG. 3 is a drawing of a portion of diode stack combination showing a cross-section of a diode and an associated stack according to the teachings of the prior disclosures.

FIG. 3 is a drawing of a portion of diode stack combination 300 showing a cross-section of a diode 201 and an associated stack 202. To form diode 201, a $p^+$ region 301 is deposited into an N-Well 302. This arrangement forms the basic structure of a p-n junction of a diode 201. The N-Well 302 may itself be arranged in a $p^+$ substrate 305. Above this diode are deposited various layers of connections, for example various contacts, vias, and metal interconnects. As shown in FIG. 3, contact 320 connects diode 201 to a first metal layer comprising wire 325. The first metal layer may also comprise a second wire 325' coupled to wire 325 through vias 303 and a horizontal interconnect wire 310.

Horizontal interconnect wire 310 may comprise a salicided polysilicon wire 312/314 comprising polysilicon sections 312 and 314 on top of which a silicide layer 316 is formed. The silicide layer may comprise $TiS_2$, $CoSi_2$, NiSi, $WSi_2$, or any other suitable material.

In some embodiments, the polysilicon wire portion may be formed by two differently doped polysilicon sections 312 and 314. Section 314 may be $p^+$ doped and section 312 may be $n^+$ doped. The two sections divide the horizontal polysilicon wire into two sections of approximately equal length as shown in FIG. 3. In some embodiments, sections 312 and 314 may not have equal lengths, but any length appropriate to form a functional diode under layer 316. As described, sections 312 and 314 are complementary doped polysilicon forming a reverse biased diode within the poly interconnect 310. The silicide layer 316 if properly formed short circuits the diode. In such embodiments, the diode formed by sections 312 and 314 only becomes active if the silicide layer 316 is improperly formed.

Vias 303 between connections 304 form the vertical stack 202. The entire stack 202 is electrically connected to horizontal wire 310. In the embodiment shown, vertical stack 202 is connected above the $n^+$ doped section 312. Another via 303 located above the $p^+$ doped section connects the polysilicon wire 310 to metal layer 325. At this point, if silicide layer 316 is improperly formed, the two sections 312 and 314 form a reverse biased diode and force an open circuit as compared to a conventional uniformly doped polysilicon layer that would merely have a reduced resistance if the overlaying polysilicide layer is improperly formed. The open circuit caused by the reversed biased diode can be easily detected by a test machine as described in relation to FIG. 1. The diode formed by sections 312 and 314 is in the opposite orientation with respect to current flow in comparison to the decode diode 201 formed by $p^+$ region 301 is deposited into an N-Well 302. Both diodes may be reversed, but if one is reversed, both must be.

In some embodiments, the stack 202 of connections 303 and 304 formed by the various layers may be used for monitoring the manufacturing process of the interconnect layers. In some embodiments, the stack 202 may only include via 303 and metal wire 325' or may include only a single connecting via 303 or metal contact. The connecting structure coupled to the silicide layer 316 above the $n^+$ doped section 312 may have a variety of forms without departing from the scope of the present disclosure.

As shown in FIG. 3, stack 202 may include multiple wires 304 and connecting vias 303 connected to the diode 201 through the horizontal interconnect 310 and contact 320, serving as a terminal for the cathode of diode 201. In some embodiments, by depositing the N-Well 302 into a P-Well 305 substrate, a parasitic PNP bipolar transistor is formed. To access the function of this transistor, an addition $P^+$ region 306 may be deposited into substrate 305 to provide a connection. Some embodiments include oxide regions 330 to further separate the various active regions from each other.

Figure 4:
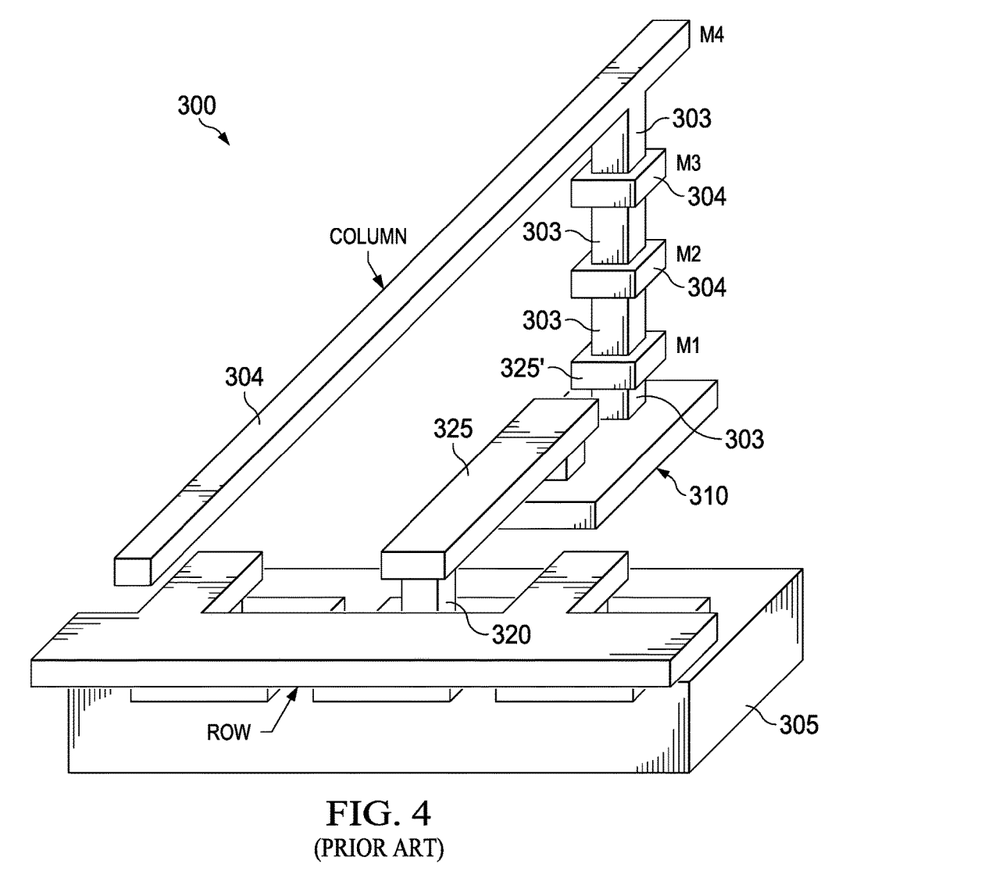
FIG. 4 is an isometric drawing showing a portion of the diode stack combination from FIG. 3 at an angle for the sake of clarity.

FIG. 4 is an isometric drawing showing a portion of diode stack combination 300 at an angle for the sake of clarity. The elements shown therein correspond to the elements shown in FIG. 3. The metal surrounds are connected to the row decoder through the N-Well 302. A forward path may be isolated through each diode to identify poorly formed or incomplete contacts and/or vias.

Figure 5:
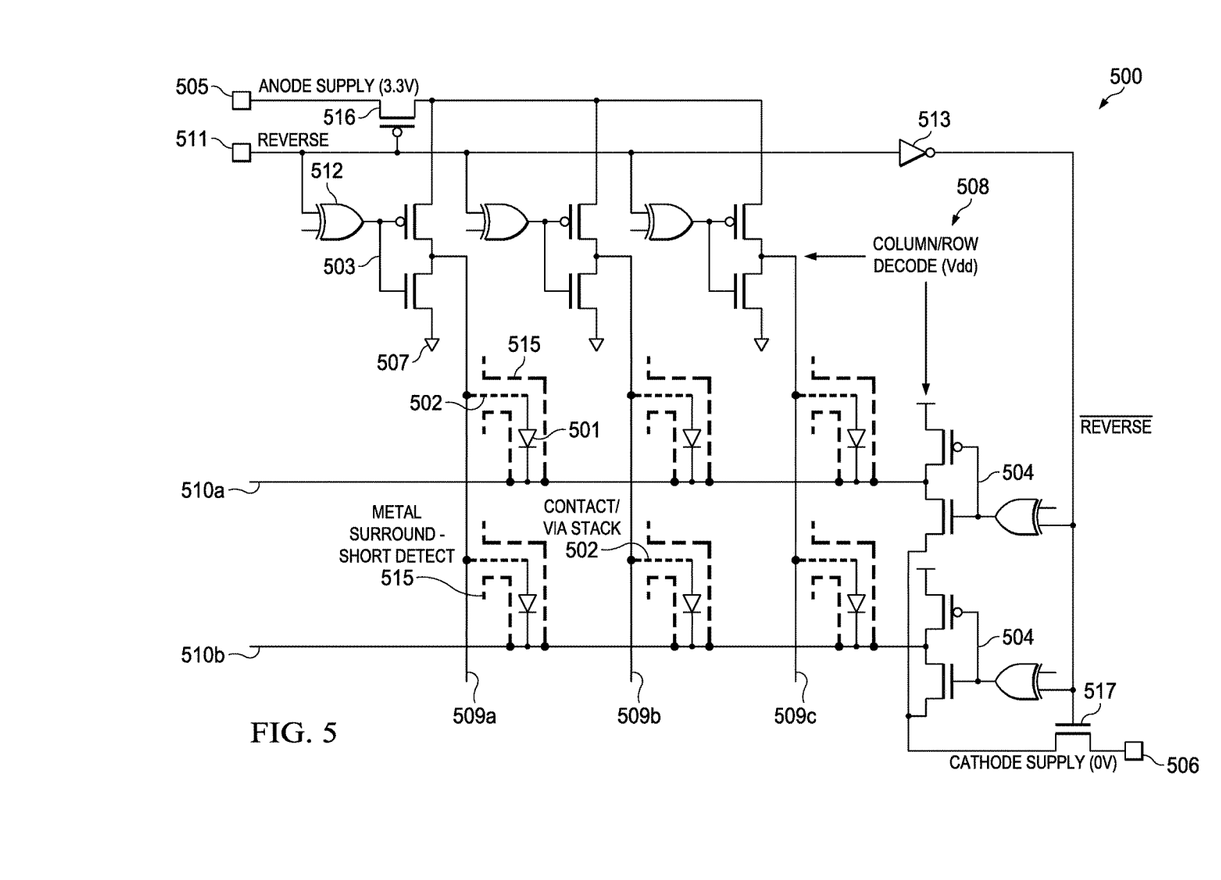
FIG. 5 is a drawing showing an example electrical circuit including an array of diodes according to the teachings of the present disclosure.

FIG. 5 is a drawing showing an example electrical circuit 500 including an array of diodes 501 according to the teachings of the present disclosure. For purposes of illustration, so the diodes 501 may be addressed as an array, the drawing of circuit 500 shows the diodes 501 laid out and connected as a two-dimensional array with columns and rows. Each diode 501 in the array of diodes has an associated stack 502 of vertical interconnects and metal contacts, which may include a polysilicon diode covered with a silicide layer as discussed in relation to FIG. 3.

Electrical circuit 500 may include a column inverter 503 connected to each column 509 of diodes 501 at the respective cathodes. Column inverters 503 may act as a control mechanism to select a column 510 for testing the diode 501 and associated stack 502. A voltage source 505 may be connected to the anode of each of the column inverters 503. In some embodiments, voltage source 505 may be three point three (3.3) volts.

Electrical circuit 500 may include a row inverter 504 connected to each row 510 of diodes 501 at the respective cathodes. Row inverters 504 may act as a control mechanism to select a row 510 for testing the diode 501 and associated stack 502. A voltage supply 506 may be connected to all the row inverters 504. In some embodiments, voltage supply 506 may be zero volts.

Each column inverter 503 may include inputs allowing selection of voltage source 505 (a relatively high voltage) or voltage source 507 (a relatively low voltage). Voltage source 507 may be ground. Each row inverter 504 may include inputs for selecting whether the row inverter 504 will route the voltage supply 506 or a high voltage 508. In some embodiments, high voltage 508 may be five volts. Any given stack 502 of vertical interconnects and contacts will then be in series with the column inverter 503 and a diode 501.

In contrast with circuit 200 described above, circuit 500 may include additional components comprising a reversible decoder to switch the polarity of the decoders. In the original polarity, circuit 500 allows testing for open circuits. Once the polarity is reversed, circuit 500 may be similarly used to check for inadvertent short circuits in metal layers or contacts. The techniques used to isolate the defect, including identifying the diode/connection stack by row and column remain effective. In this context, transistor 516 and 517 may be present to disconnect power from voltage source 505 to the columns 509 and voltage source 506 from rows 510.

For example, circuit 500 includes metal surrounds 515 for each contact/via stack 502. The details of metal surrounds 515 are more clear in FIG. 6 and will be discussed in that context. The electrical pathway defined through metal surrounds 515 are part of the reverse polarity circuit. The metal surrounds 515 are each connected to the respective row decoder 504. As with the prior circuit, a forward path may be isolated through each diode to identify poorly formed or incomplete contacts and/or vias. In addition, however, a reverse path is now available to look for via-to-metal shorts and/or metal-to-metal shorts in an isolated stack. To complete the reversal, XOR gates 512, NOT gate 513, and additional components may be applied. For example, disconnecting power from sources 505 and 506 with transistors 516 and 517 allows the unselected rows and columns to float. That is, the sources are isolated and cannot drive the stacks. As a result, unrelated shorts will not interfere with the selected row/column.

Figure 6:
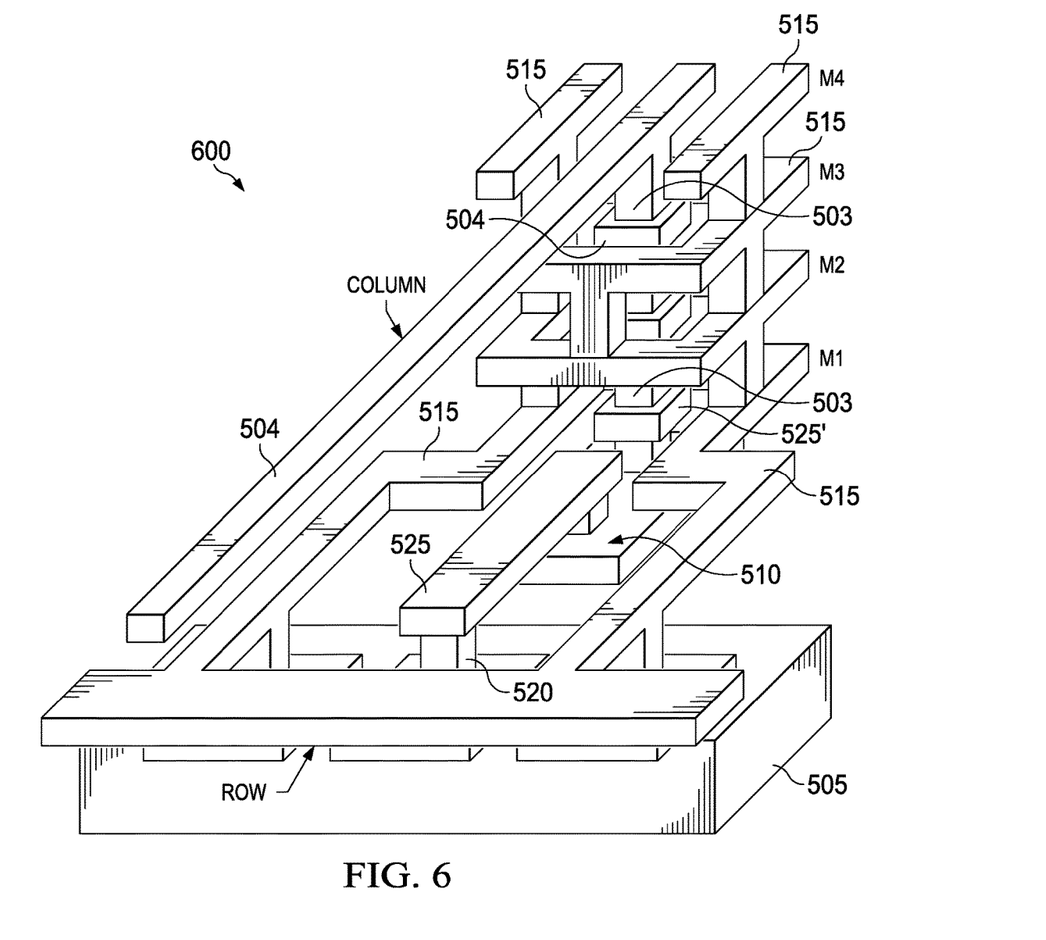
FIG. 6 is an isometric drawing showing a portion of diode stack combination at an angle for the sake of clarity.

FIG. 6 is an isometric drawing showing a portion of diode stack combination 600 at an angle for the sake of clarity. To form the diode 501, a $p^+$ region is deposited into an N-Well. This arrangement forms the basic structure of a p-n junction of a diode 501. The N-Well may itself be arranged in a $p^+$ substrate 505. Above this diode are deposited various layers of connections, for example various contacts, vias, and metal interconnects. As shown in FIG. 6, contact 520 connects diode 501 to a first metal layer comprising wire 525. The first metal layer may also comprise a second wire 525' coupled to wire 525 through vias 503 and a horizontal interconnect wire 510. Horizontal interconnect wire 510 may comprise a salicided polysilicon wire with sections on top of which a silicide layer is formed, as discussed in relation to FIG. 3. The silicide layer may comprise $TiS_2$, $CoSi_2$, NiSi, $WSi_2$ or any other suitable material.

In some embodiments, the polysilicon wire portion may be formed by two differently doped polysilicon sections. The first section may be p$^+$ doped and the second section may be n$^+$ doped. The two sections divide the horizontal polysilicon wire into two sections of approximately equal length. In some embodiments, the two sections may not have equal lengths, but any length appropriate to form a functional diode under layer. As described, the two sections are complementary doped polysilicon forming a reverse biased diode within the poly interconnect. The silicide layer, if properly formed, short circuits the diode. In such embodiments, the diode formed only becomes active if the silicide layer is improperly formed.

Vias 503 between connections 504 form the vertical stack. The entire stack is electrically connected to horizontal wire. In the embodiment shown, the vertical stack is connected above the n$^+$ doped section. Another via 503 located above the p$^+$ doped section connects the polysilicon wire 510 to metal layer 525. At this point, if the silicide layer is improperly formed, the reverse biased diode forces an open circuit as compared to a conventional uniformly doped polysilicon layer that would merely have a reduced resistance if the overlaying polysilicide layer is improperly formed. The open circuit caused by the reversed biased diode can be easily detected by a test machine as described in relation to FIG. 1. The diode formed is in the opposite orientation with respect to current flow in comparison to the decode diode 501 formed by the p$^+$ region deposited into an N-Well. Both diodes may be reversed, but if one is reversed, both must be.

In some embodiments, the stack of connections 503 and 504 formed by the various layers may be used for monitoring the manufacturing process of the interconnect layers. In some embodiments, the stack may include multiple vias 503 and metal wire 525' or may include only a single connecting via 303 or metal contact. The connecting structure coupled to the silicide layer above the n$^+$ doped section may have a variety of forms without departing from the scope of the present disclosure.

As shown in FIG. 6, the stack may include multiple wires 504 and connecting vias 503 connected to the diode 501 through the horizontal interconnect 510 and contact 520, serving as a terminal for the cathode of diode 501. In some embodiments, by depositing the N-Well into a P-Well substrate, a parasitic PNP bipolar transistor is formed. To access the function of this transistor, an addition P$^+$ region may be deposited into substrate 305 to provide a connection. Some embodiments include oxide regions to further separate the various active regions from each other.

The metal surrounds 515 are each connected to the respective row decoder 504 through an N-Well. When the reverse polarity is engaged, the reverse path will identify via-to-metal and metal-to-metals shorts using the test apparatus of FIG. 1.

Figure 7:
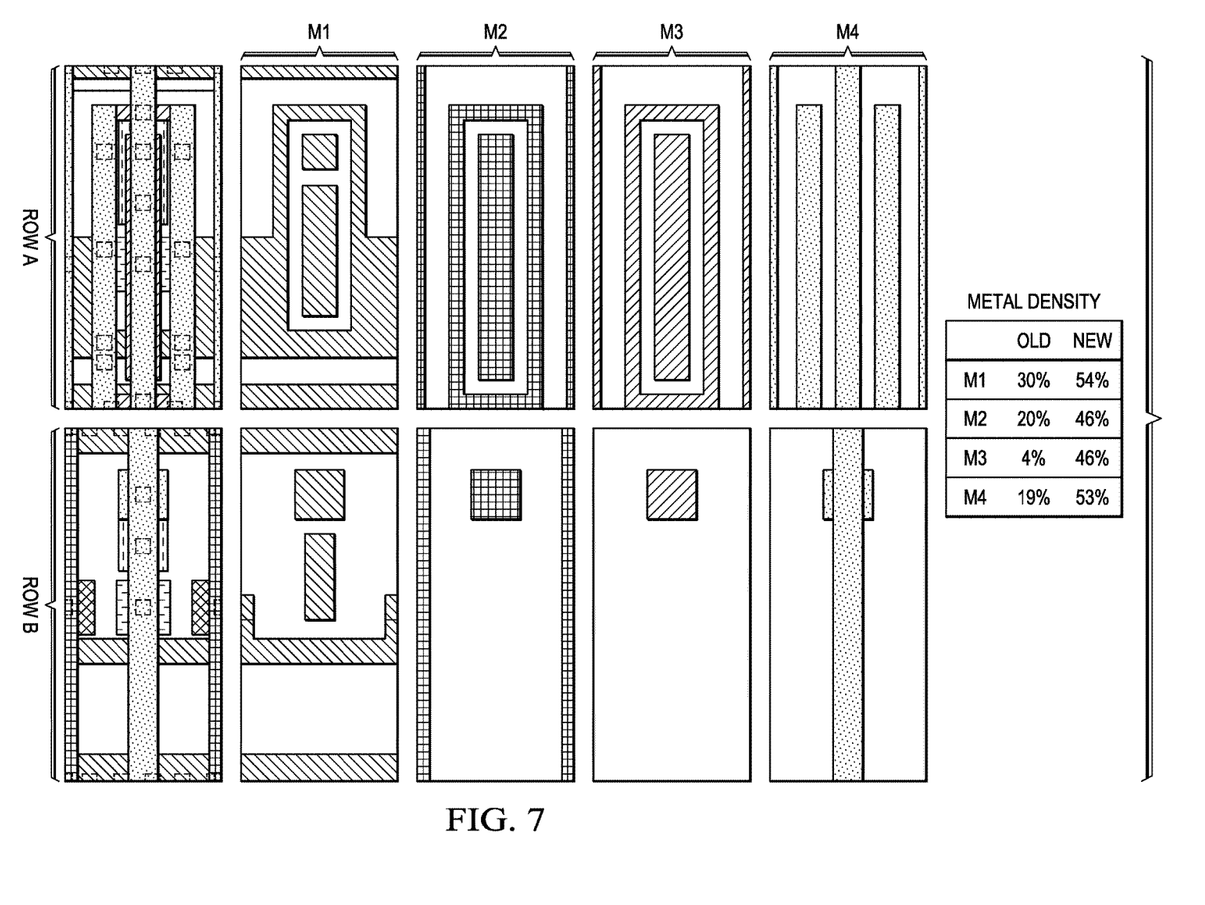
FIG. 7 is a drawing showing a schematic of various layers in comparison between the prior disclosures and the teachings of the present disclosure.

FIG. 7 shows a comparison of the conventional cells and the new cells and associated metal density. Row A shows layers M1-M4 corresponding to diode/stack/metal surrounds 600 of FIG. 6 and Row B shows layers M1-M4 of FIG. 3.

The invention claimed is:

1. A system for process monitoring of semiconductor fabrication, the system comprising:
   a semiconductor chip;
   a plurality of arrays disposed on the semiconductor chip;
   the arrays comprising a plurality of diodes, each diode formed in the semiconductor chip, each diode associated with a stack comprising a plurality of vertical interconnects and metal contacts, the stack and the diode connected in series forming a diode stack combination;
   a plurality of control mechanisms for addressing the plurality of diodes;
   wherein the plurality of control mechanisms comprise:
      first inverters for applying either a high or a low voltage to one or more columns of the diode stack combinations in one of the plurality of arrays, connected at a first end of each diode stack combination;
      second inverters for applying either a high or a low voltage to one or more rows of the diode stack combinations in the one of the plurality of arrays, connected at a second end of said diode stack combination; and
      transistors for disconnecting voltage sources to allow unselected diodes from the plurality of diodes to float.

2. The system of claim 1, wherein:
   the diodes are formed by a first p-type semiconductor deposition into an n-type well arranged within a p-type substrate;
   the semiconductor chip further comprises a plurality of electrical connections for each diode, the electrical connections each formed by of a second p-type semiconductor deposition into the p-type substrate; and
   the arrays further comprise a plurality of p-n-p parasitic transistors comprised of said electrical connections, said p-type substrate, said n-type well, and said first p-type semiconductor depositions.

3. The system of claim 2, wherein said parasitic transistors share a physical location with said diodes, and said parasitic transistors and said diodes are connected in parallel.

4. The system of claim 1, wherein a plurality of p-type semiconductor regions are deposited adjacent to each said diode, and the p-type semiconductor regions are connected to the terminal of a transistor adjacent to the diode in the substrate of the chip.

5. The system of claim 4, wherein the p-type semiconductor regions adjacent to each diode in an array are connected.

6. The system of claim 4, wherein the p-type semiconductors regions are connected to a first voltage having a lower potential than said high voltage applicable to a column of diode and stack combinations.

7. A semiconductor chip for process monitoring of semiconductor fabrication, the semiconductor chip comprising:
   a plurality of arrays disposed on the semiconductor chip;
   each array comprising:
      a plurality of diodes, each diode formed in the semiconductor chip and associated with a stack including a plurality of vertical interconnects and metal contacts,
      each one of the plurality of diodes and the associated stack connected in series to form a diode stack combination; and
      a plurality of control mechanisms for addressing the plurality of diodes;
   wherein said control mechanisms comprise:

a first source for applying a relatively high or low voltage to one or more columns of the diode stack combinations in a given array, connected at a first end of said diode stack combination;

a second source for applying a relatively high or low voltage to one or more rows of the diode stack combinations in the given array, connected at a second end of said diode stack combination, and a reversible decoder to control the polarity of the first and second sources;

a current meter measuring a current through the diode stack combinations.

8. The semiconductor chip of claim 7, wherein the control mechanisms comprise inverters.

9. The semiconductor chip of claim 7, further comprising a plurality of electrical connections for each diode, wherein the diodes comprise a p-n transition within said semiconductor chip formed by a first p-type semiconductor deposition into an n-type well arranged in a p-type substrate;

the electrical connections including deposition of a second p-type semiconductor into the p-type substrate; and the plurality of arrays further comprising a plurality of p-n-p parasitic transistors comprising the plurality of electrical connections, the p-type substrate, the n-type well, and the first p-type semiconductor depositions.

10. The semiconductor chip of claim 9, wherein each parasitic transistor shares a physical location with an associated diode, and the parasitic transistors and the diodes are connected in parallel.

11. The semiconductor chip of claim 7, further comprising a plurality of p-type semiconductor regions arranged adjacent to each diode, the p-type semiconductor regions connected to the terminal of a transistor adjacent to the diode in the substrate of the semiconductor chip.

12. The semiconductor chip of claim 11, wherein the p-type semiconductor regions adjacent to each diode in each array are connected to each other.

13. The semiconductor chip of claim 11, further comprising the p-type semiconductors connected to a first voltage with a lower potential than the relatively high voltage applicable to a column of diode and stack combinations.

* * * * *